United States Patent [19]
Landis

[11] 3,946,300

[45] Mar. 23, 1976

[54] HIGH FREQUENCY POWER SUPPLY

[75] Inventor: James P. Landis, Wauwatosa, Wis.

[73] Assignee: Pillar Corporation, Milwaukee, Wis.

[22] Filed: Nov. 8, 1973

[21] Appl. No.: 413,833

[52] U.S. Cl................. 321/8 C; 321/25; 321/45 R; 336/62; 336/175
[51] Int. Cl.² ..................... H02M 7/44; H01F 37/02
[58] Field of Search.......... 307/88 MP; 336/62, 175, 336/233; 323/89 C; 321/45 R, 25, 8 C

[56]            References Cited
               UNITED STATES PATENTS

| | | | |
|---|---|---|---|
| 1,792,375 | 2/1931 | Jakosky | 336/175 X |
| 3,042,849 | 7/1962 | Dortort | 336/175 X |
| 3,085,188 | 4/1963 | Drabeck et al. | 321/8 C |
| 3,317,742 | 5/1967 | Guerth | 307/88 MP |
| 3,387,201 | 6/1968 | Greenberg et al. | 321/45 |
| 3,451,023 | 6/1969 | Aveyard et al. | 336/175 |
| 3,668,506 | 6/1972 | Beasley et al. | 321/8 C |
| 3,786,334 | 1/1974 | Johannessen | 321/45 R |

Primary Examiner—William H. Beha, Jr.

[57] ABSTRACT

A high frequency power supply circuit for supplying energy to a parallel resonant tank circuit and including a pair of serially connected capacitors having a common terminal connected to the load. The other capacitor terminals are respectively connected to the load through saturable reactors. A substantially constant current bias supply circuit is connected across the other terminals of the reactors and polarized in a manner to produce current flow through the reactors in a direction opposite to that produced by the capacitor discharge. The saturable reactors may comprise a plurality of annular core members disposed on an elongate tubular conductor. Alternatively the reactors may comprise a plurality of core members having an axially extending toroidal winding therearound.

12 Claims, 8 Drawing Figures

HIGH FREQUENCY POWER SUPPLY

BACKGROUND OF THE INVENTION

This invention relates to improvements in power supplies and specifically to power supplies for delivering high frequency high energy pulses.

Capacitor discharge systems are commonly employed for the delivery of high frequency energy pulses having alternate polarities. A typical application for this type of system is to supply energy to induction heating loads operating at frequencies in the kilocycle range. Such a load, commonly taking the form of a parallel resonant tank circuit, can readily be driven by high energy pulses delivered at a repetition rate equal to a sub-multiple of the natural resonant frequency of the tank circuit. However, although the repetition rate of the delivered pulses can be lower than the operating frequency of the tank circuit, the width of the pulses should not exceed one-half cycle of the resonant frequency. Thus, pulses utilized for driving tank circuits operating at 50 kilocycles, for example, must be narrow, not exceeding about 10 microseconds. Furthermore, although the repetition rate of the pulses can be lower than the operating frequency of the tank circuit, the repetition rate is nevertheless high, and the pulse generation demands the use of rapid acting, efficient switching elements.

Some prior art high frequency high power supply systems have employed energy storage capacitors which are alternately charged and then discharged through the tank circuit. In addition, saturable reactors have been employed in the capacitor discharge circuits of such systems. As those skilled in the art will appreciate, saturable reactors include a saturating ferromagnetic core and manifests its unsaturated impedance during portions of the operating cycle wherein the core is not saturated and is capable of developing a high rate of change of core flux. On the other hand, saturated impedance is manifested when the maximum flux density of the core has been reached and the core becomes substantially unable to develop any further rate of change of flux. In the saturated state, the device behaves essentially as an air core reactor, having an inductance comparable to what would prevail in the absence of the core material. The core material of such reactors must be capable of the duty imposed by frequent excursions in and out of saturation without overheating. Secondly, the device must posses a suitably low saturated inductance to discharge the capacitor into the load at the required rate.

SUMMARY OF THE INVENTION

An object of the invention is to provide an improved system for delivering high frequency, high energy pulses of alternate polarity.

A further object of the invention is to provide a new and improved saturable reactor for use in a system for delivering high energy, high frequency pulses.

Another object of the invention is to provide for use in high energy, high frequency power supply systems a reactor having moderate levels of core loss during very high frequency operation.

Yet another objective is to provide a reactor system having a high ratio of saturated to unsaturated reactance.

A further object of the invention is to provide a reactor system having extremely low saturated reactance commensurate with the delivery of high energy pulses of very short duration.

These and other objects and advantages of the invention will become more apparent from the detailed description of the preferred embodiments thereof taken with the accompanying drawings.

In general terms the invention comprises circuit means for supplying high frequency power to a load and including an energy storage means, energy source means for charging the energy storage means, first switching circuit means for periodically connecting the energy source to the energy storage means at a frequency related to the high frequency, discharge means for discharging the energy storage device into the load, the discharge means including saturable reactor means including a plurality of annular cores of magnetic material disposed coaxially on a tubular conductor. Means may also be provided for cooling the conductor and cores. According to an alternate embodiment, a saturable reactor includes a toroidal winding disposed axially on a plurality of annular cores.

DETAILED DESCRIPTION OF THE PREFERRED EMBODIMENTS

Figure 1:
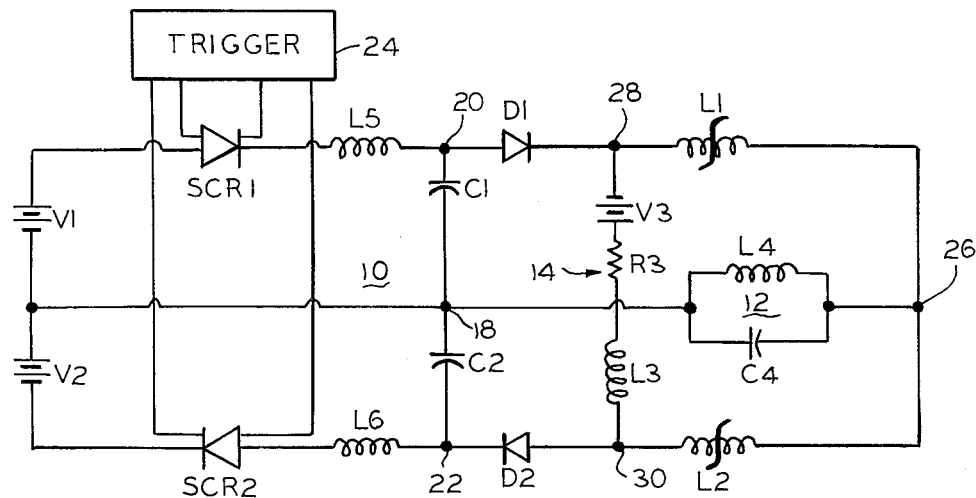
FIG. 1 schematically illustrates a high frequency, high energy, power supply system according to the invention.

FIG. 1 illustrates a high frequency, high energy power supply circuit for delivering high frequency, high energy impulses to a load 12. In general terms, a pair of energy storage means such as capacitors C1 and C2 are connected for being alternately charged from DC voltage sources V1 and V2 respectively, and for being discharged to load 12 through saturable reactors L1 and L2. A bias circuit 14 is coupled to each of the reactors L1 and L2 to reset the saturable reactors after each energy pulse. The DC voltage sources V1 and V2 are illustrated as being batteries but it will be appreciated that they may take any suitable form, such as, for example, an AC source and rectifiers.

The capacitors C1 and C2 have a common terminal 18 which is connected to the negative terminal of source V1 and the positive terminal of V2 while the opposite terminal 20 of capacitor C1 is connected to the positive terminal V1 through a first switching device SCR 1 and the opposite terminal capacitor C2 is coupled to the negative terminal of V2 through a second switching device SCR 2. In this manner, when capacitor C1 is charged, terminal 20 will be positive and when capacitor C2 is charged, terminal 22 will be negative. The switching devices SCR1 and SCR 2 may take any convenient form such as, for example, silicon controlled rectifiers the gate electrodes of which may be coupled to a suitable trigger circuit 24. As those skilled in the art will appreciate, the trigger circuit 24 may be of any well known type which provides gate signals to SCR 1 and SCR 2 in a timed sequence such that capacitors C1 and C2 will be coupled to voltage sources V1 and V2 for being charged in accordance with the desired frequency of the power supply circuit 10.

The load 12 may be of the type utilized with an induction heating apparatus which for example may include an inductor or heating coil L4 and a variable capacitor C4 which may be adjusted to meet the particular operating conditions. The value of the inductance of L4 and the capacitance of C4 determines the resonant frequency of the load circuit 10 and hence the output frequency at which the power supply 14 will operate. Terminal 20 of capacitor C1 is connected to a first terminal 28 of load circuit 12 through diode D1 and saturable reactor L1 and terminal 22 of capacitor C2 is connected to terminal 30 through diode D2 and saturable reactor L2.

The bias circuit 14 may include a voltage source V3, a current limiting resister R3 and a current stabilizing inductor L3 which are connected in series with each other and the series combination connected between the terminals 28 and 30 of saturable reactors L1 and L2 respectively which terminals are on the sides of said reactors opposite to load terminal 26. The voltage source V3 may provide a very low voltage level and the inductor L3 is preferably sized to maintain substantially constant current output during the variations in voltage imposed on the reactors L1 and L2.

Inductors L5 and L6 may be respectively connected between SCR 1 and terminal 20 and SCR 2 and terminal 22. It will be appreciated that the capacitance of capacitors C1 and C2 will generally be determined by the power requirements of the load 12 and inductors L5 and L6 are provided to regulate the charging times of capacitors C1 and C2 to the desired values. In addition, inductors L5 and L6 function to turn off their respective SCR's 1 and 2 at the completion of the charging cycles of capacitors C1 or C2. For example, it will be appreciated that as the capacitor C1 becomes charged, the current through inductor L5 will decrease whereby the resultant collapse of the field in L5 will generage a self-induced emf greater than that of the voltage source V1 whereby SCR 1 will be turned off.

In operation of the circuit illustrated in FIG. 1, SCR 1 and SCR 2 are fired in a timed sequence according to the frequency requirement of the system. Assume for example that SCR 1 is fired first. This couples terminal 20 to the positive terminal of voltage source V1 whereupon capacitor C1 begins charging. The saturable reactor L1 presents a relatively high impedance to current flow during the charging interval of capacitor C1 so that C1 is substantially isolated from load 12. After capacitor C1 is fully charged and concurrently with or shortly after the time that inductor L5 turns SCR 1 off, a slight current flow will pass to reactor L1 causing the latter to saturate thereby presenting a low impedance to discharge current from capacitor C1 to the load 12. When this discharge current has substantially terminated, the saturable reactor L1 will be returned to its unsaturated state.

The bias circuit 14 is coupled to provide a positive current flow from terminal 28 to terminal 30 and its parameters are selected so that it will provide a substantially constant bias current at all times during the operating cycle regardless of the instantaneous voltages applied at the terminals. The circuit 14 produces a component of bias current through each of the saturable reactors L1 and L2 which is opposite in direction to the main load component of current through diode D1 and D2. By properly selecting the bias current, the magnetic flux density in each of the reactors L1 and L2 can be reduced to an initial desired flux density after the completion of its respective power impulse.

Figure 2:
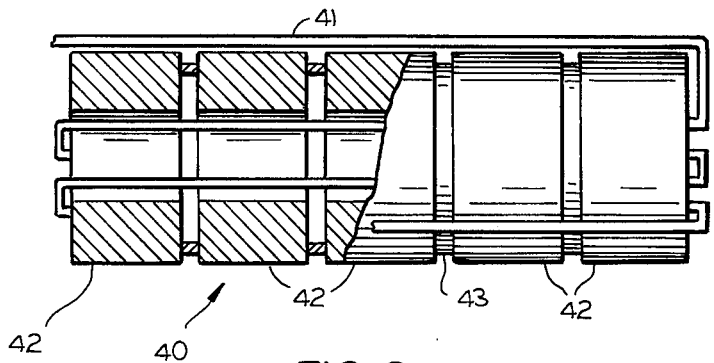
FIGS. 2-8 illustrate alternate saturable reactor configurations which may be employed in the power supply circuit of FIG. 1.

FIG. 2 illustrates a reactor configuration which may be employed as the saturable reactors L1 and L2 in the system illustrated in FIG. 1. The reactor consists of a core 40 and a winding 41. Core 40 may comprise one or more hollow cylindrical members 42 which may be composed of a suitable magnetic material having low conductivity such as ferrite. The number of members 42 will depend upon the cross-sectional area of core required in order to maintain core heating within desirable limits. The use of a low conducitivity material is desired in order to minimize eddy current losses. The inductor illustrated in FIG. 2 may be disposed in a suitable cooling fluid such as silicone oil and when a plurality of core member 42 are employed, non-magnetic spacers 43 may be disposed between members 42 to permit the circulation of such cooling fluid. The winding 41 may consist of hollow copper tubing wound around core 40 in a toroidal configuration and through which a suitable cooling fluid such as water may be circulated. Inductors of the type illustrated have been found to be satisfactory at pulse repetition rates in excess of 10,000 per second.

Figure 3:
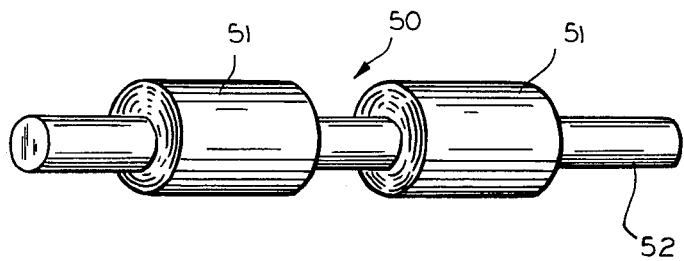
Figure 5:
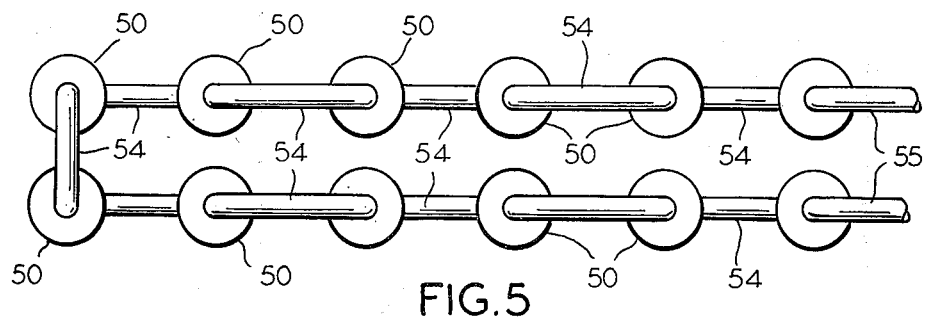
Figure 4:
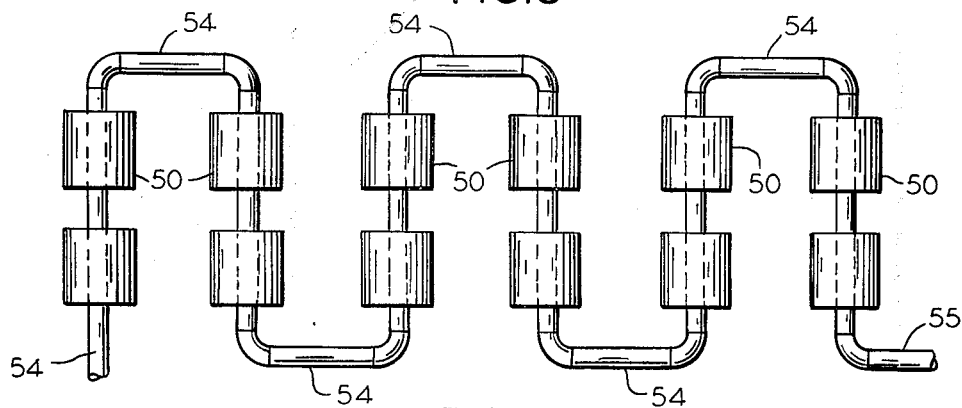

The inductor illustrated in FIG. 3 has been found particularly satisfactory for high current low voltage applications where the required saturated reactance must be moderately low. The inductor consists of one or more cores 51 comprising the sheet strip which is wound directly on a copper tube 52 having a suitable outside diameter which comprises the conductor. The number of cores 51 which may be employed will be determined by the desired total core cross-sectional area. Winding the strip directly on the copper tube 52 permits the tube to be cooled by a suitable cooling fluid such as water whereby excellent heat transfer from the core material may be achieved. In addition, it is possible to operate the core at high temperatures since a supporting structure can be provided which isolates the high temperature core from any material which might be damaged by such heat. An example of a reactor utilizing the structure of FIG. 3 is illustrated in FIGS. 4 and 5 wherein a plurality of such section 50 are joined by generally U-shaped tubular members 54 which connect the tubes 52 in a series sinusoidal configuration. The reactor of FIGS. 4 and 5 may be suitably energized, such as by conductors 55.

Figure 6:
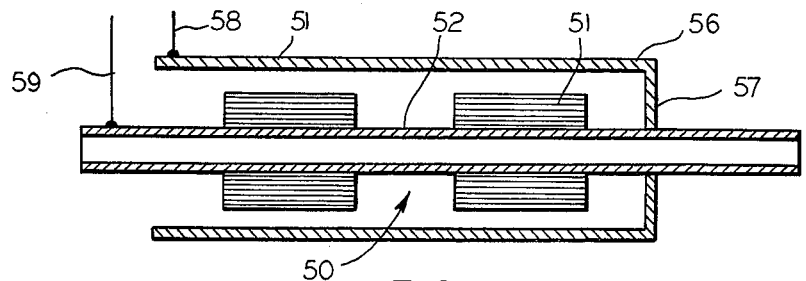

FIG. 6 illustrates an alternate embodiment employing the reactor sections illustrated in FIG. 3. Here the return current path is composed of a concentric shell 56 of a suitable conductive material such as copper. One end 57 of shell 56 closes on tube 52 and the other end of the shell and tube are respectively connected between the energy source and load by the symbolized connections 58 and 59. The cores 51 are separated from the shell 56 by air or some other suitable insulating material so that the reactor will not be short circuited.

Figure 7:
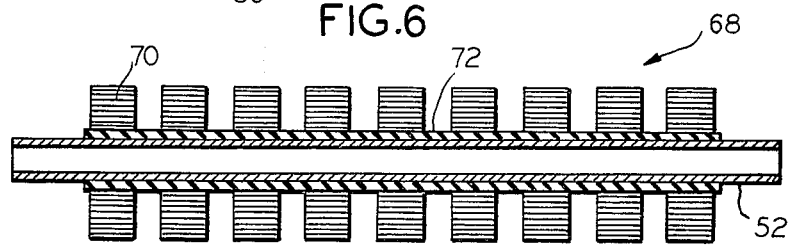

FIG. 7 illustrates a modified form of the reactor section 68, wherein the individual wound cores are replaced by annular ferrite core sections 70. This configuration is suitable for still higher frequency operations, i.e. in the order of 10 Khz. Since the heat transfer characteristics of ferrite are relatively poor and since the material is comparatively brittle and would be subject to being fractured by the expansion of the central tube 52, the individual core portions 70 are preferably spaced from the tube 52 by insulating material which may take any convenient form such as strips 72 disposed axially along tube 52. It will be understood that the individual reactor sections 68 illustrated in FIG. 7 may be interconnected in a manner similar to that illustrated in FIGS. 4-6 with respect to the core 50 of FIG. 3.

Figure 8:
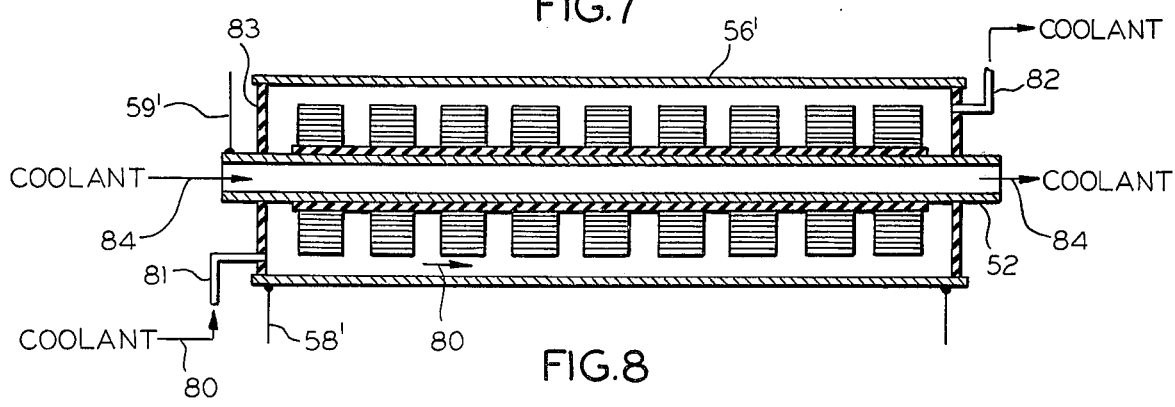

FIG. 8 illustrates how the inductor portions of FIGS. 3 and 7 and using the tubular return path configuration of FIG. 6 may be cooled in the event air cooling is not satisfactory. Here the coolant symbolized by the arrow 80 is delivered to one end of the tube 56' by an inlet connection 81 and withdrawn from the opposite end thereof through an outlet connection 82. The normally open end of the tube 56' is closed by an insulating closure member 83. Coolant symbolized by arrow 84 may also be delivered to the interior of tubular member 52.

Each of the reactor configurations illustrated and discussed hereinabove is characterized by the use of a core which can possess very high magnetic permeability and rapid switching capability. No gaps or joints are incorporated and high performance magnetic materials can be used. Hence the unsaturated reactance can be high and the transition to low reactance, upon saturation, can be very rapid. In addition, each of the above reactor configurations is characterized by windings of simple geometry. Thus, the level of reactance in the saturated state can be readily predetermined. Furthermore, the configurations and windings are such as to provide low values of saturated reactance, as required for rapid capacitor discharges. In addition, the reactor configurations, according to the invention, readily lend themselves to the application of cooling fluids when required. The illustrated reactor core and winding configurations also permit excursions into and out of saturation without overheating. In addition, the circuit design permits magnetization of the reactor cores to occur in only one direction, reducing the duty on the ferro-magnetic material.

While only a few embodiments of the invention have been disclosed, it is not intended to be limited thereby but only by the scope of the appended claims.

I claim:

1. A circuit means for supplying high frequency power to a load and including energy storage means,
    energy source means for charging the energy storage means,
    first switching circuit means for periodically connecting the energy source means to the energy storage means at a frequency related to the said high frequency,
    discharge means for discharging the energy storage means into the load, said discharge means including saturable reactor means,
    said saturable reactor means including an elongate hollow conductor and at least one substantially annular core means mounted on said conductor and in heat exchange contact therewith and composed of a strip of magnetic material having a relatively high permeability and wound directly on said conductor, said conductor being constructed and arranged for receiving a cooling fluid therein.

2. A circuit means for supplying high frequency power to a load and including energy storage means,
    energy source means for charging the energy storage means,
    first switching circuit means for periodically connecting the energy source means to the energy storage means at a frequency related to the said high frequency,
    discharge means for discharging the energy storage means into the load, said discharge means including saturable reactor means,
    said saturable reactor means including an elongate hollow conductor and at least one substantially annular core means mounted on said tubular member and in heat exchange contact therewith composed of a material having a relatively high permeability,
    elongate, generally tubular conductive housing means disposed in surrounding relation to at least a portion of said conductor and core means, and being spaced therefrom,
    and conductive means coupled to the ends of each of said housing means and conductor.

3. The circuit means set forth in claim 2 and including a plurality of annular core means mounted in spaced apart relation on said conductor and in heat exchange contact therewith.

4. The circuit means set forth in claim 3 wherein each of said core means comprises a strip of magnetic material wound directly on said conductor.

5. The circuit means set forth in claim 4 wherein said saturable reactor means comprises a plurality of conductors joined end to end and configured to provide a return current path, said conductors being generally tubular, with their hollow interiors in fluid communication and a plurality of said core means mounted on each conductor and in heat exchange contact therewith.

6. The circuit means set forth in claim 2 wherein said conductor is generally hollow, and means for conducting cooling fluid through the interior of said conductor and housing means.

7. The circuit means set forth in claim 6 wherein said saturable reactor comprises a plurality of conductors joined end to end and configured to provide a return current path, said conductors being generally tubular, and a plurality of core means mounted on each conductor.

8. A circuit means for supplying high frequency power to a load and including energy storage means,
    energy source means for charging the energy storage means,
    first switching circuit means for periodically connecting the energy source means to the energy storage means at a frequency related to the said high frequency,
    discharge means for discharging the energy storage means into the load, said discharge means including saturable reactor means,
    said saturable reactor means including an elongate generally tubular conductor and a plurality of annular core means mounted in spaced apart relation on said tubular conductor and composed of a material having a relatively high permeability,
    coolant means is circulated through the interior of said tubular conductor,
    elongate conductive housing means disposed in surrounding relation to at least a portion of said conductor and conductive means and coupled to the ends of each of said housing means and conductor.

9. The circuit set forth in claim 8 and including means for circulating cooling fluid through said conductor and housing.

10. The circuit means set forth in claim 9 wherein each of said core means comprises a winding of magnetic material.

11. The circuit means set forth in claim 9 wherein each of said core means comprises a solid substantially homogenous body of magnetic material.

12. A circuit means for supplying high frequency power to a load and including energy storage means,
  energy source means for charging the energy storage means,
  first switching circuit means for periodically connecting the energy source means to the energy storage means at a frequency related to the said high frequency,
  discharge means for discharging the energy storage means into the load, said discharge means including saturable reactor means,
  said saturable reactor means including an elongate conductor and at least one substantially annular core means mounted on said conductor and composed of a material having a relatively high permeability,
  and elongate conductive housing means disposed in surrounding relation to at least a portion of said conductor and conductive means coupled to the ends of each of said housing and conductor.

* * * * *

UNITED STATES PATENT OFFICE
CERTIFICATE OF CORRECTION

Patent No. 3,946,300  Dated March 23, 1976

Inventor(s) James P. Landis

It is certified that error appears in the above-identified patent and that said Letters Patent are hereby corrected as shown below:

Claim 2, Column 6, lines 6 and 7, cancel "tubular member" and substitute --conductor--; line 7, after "therewith" insert --, said core means being--.

Signed and Sealed this

Thirteenth Day of July 1976

[SEAL]

Attest:

RUTH C. MASON
*Attesting Officer*

C. MARSHALL DANN
*Commissioner of Patents and Trademarks*